(12) United States Patent
Chen et al.

(10) Patent No.: US 10,874,022 B2
(45) Date of Patent: Dec. 22, 2020

(54) PRINT CIRCUIT BOARD AND MANUFACTURING METHOD THEREOF

(71) Applicant: FULLPOWER TEK CO., LTD., Taoyuan (TW)

(72) Inventors: Ying-Chih Chen, Taoyuan (TW); Chao-Ming Lin, Taoyuan (TW)

(73) Assignee: FULLPOWER TEK CO., LTD., Taoyuan (TW)

( * ) Notice: Subject to any disclaimer, the term of this patent is extended or adjusted under 35 U.S.C. 154(b) by 0 days.

(21) Appl. No.: 15/939,570

(22) Filed: Mar. 29, 2018

(65) Prior Publication Data

US 2019/0230798 A1    Jul. 25, 2019

(30) Foreign Application Priority Data

Jan. 19, 2018    (TW) .............................. 107102056 A

(51) Int. Cl.
| | |
|---|---|
| H05K 1/05 | (2006.01) |
| H05K 3/46 | (2006.01) |
| H05K 1/02 | (2006.01) |
| H05K 1/03 | (2006.01) |
| H05K 3/38 | (2006.01) |
| H05K 3/02 | (2006.01) |

(52) U.S. Cl.
CPC ......... *H05K 3/4673* (2013.01); *H05K 1/0207* (2013.01); *H05K 1/036* (2013.01); *H05K 1/053* (2013.01); *H05K 1/056* (2013.01); *H05K 3/386* (2013.01); *H05K 1/0306* (2013.01); *H05K 3/022* (2013.01)

(58) Field of Classification Search
CPC .... H05K 3/4673; H05K 1/0207; H05K 1/036; H05K 1/053; H05K 3/386; H05K 3/022; H05K 1/056; H05K 1/0306
USPC .......................................................... 174/259
See application file for complete search history.

(56) References Cited

U.S. PATENT DOCUMENTS

| | | | | |
|---|---|---|---|---|
| 3,672,986 | A * | 6/1972 | Schneble, Jr. ........ | H05K 1/0373 428/139 |
| 4,927,587 | A * | 5/1990 | Takahashi ................ | C08K 3/36 264/211 |
| 2005/0100719 | A1* | 5/2005 | Kanakarajan ........... | B32B 15/08 428/209 |
| 2007/0169886 | A1* | 7/2007 | Watanabe ............... | H05K 1/036 156/325 |
| 2013/0112459 | A1* | 5/2013 | Aoshima ............... | B32B 17/064 174/255 |

(Continued)

*Primary Examiner* — Steven T Sawyer
(74) *Attorney, Agent, or Firm* — Hauptman Ham, LLP

(57) ABSTRACT

A print circuit board and a manufacturing method thereof are disclosed. The print circuit board includes a first substrate, a first insulating layer and a metal sheet. The first insulating layer is formed between the first substrate and the metal sheet. The insulating layer includes silicon-based polymer compound. The manufacturing method for the print circuit board includes the following steps: coating a first substrate and a metal sheet with insulating material, placing the first substrate and the metal sheet into a heating device to bake the insulating material on the first substrate and the metal sheet, and bonding the metal sheet onto the first substrate through thermally pressing the baked insulating material. The insulating material includes silicon-based polymer compound.

20 Claims, 25 Drawing Sheets

(56) References Cited

U.S. PATENT DOCUMENTS

2015/0159043 A1* 6/2015 Lai ........................ H05K 1/036
  428/213
2016/0329549 A1* 11/2016 Chatroux ............ H01M 2/0267
2018/0186133 A1* 7/2018 Wu ........................ H05K 3/386

* cited by examiner

PRINT CIRCUIT BOARD AND MANUFACTURING METHOD THEREOF

BACKGROUND OF THE INVENTION

Field of the Invention

The invention relates to a printed circuit board and a manufacturing method thereof, and more particularly to a printed circuit board and a manufacturing method thereof utilizing silicon-based polymer compound to bond a metal sheet and a substrate or bond two substrates.

Description of the Related Art

Referring to FIGS. 1A, 1B and 1C, a manufacturing method of a conventional printed circuit board is illustrated. As shown in FIG. 1A, a surface of a substrate 10 and a surface of a copper sheet 20 are oxidized to enable the surfaces of the substrate 10 and the copper sheet 20 to become rougher. Afterwards, as shown in FIG. 1B, an insulating plastic film 30 is placed between the oxidized substrate 10 and the oxidized copper sheet 20. The substrate 10, the insulating plastic film 30 and the copper sheet 20 are thermally pressed so as to bond the copper sheet 20 to the substrate 10 through the insulating plastic film 30 as shown in FIG. 1C. The rough surfaces of the substrate 10 and the copper sheet 20 increase contacting area with the insulating plastic film 30 so as to increase bonding strength.

The conventional printed circuit board manufactured by the described method usually has a thickness greater than 100 micro-meter. Such a thickness may reduce heat conduction rate of the aluminum substrate or the copper substrate, and thus causes failure or malfunction of electronic products mounted on the printed circuit board. The electronic products using such a printed circuit board cannot become more compact.

BRIEF SUMMARY OF THE INVENTION

The invention provides a printed circuit board and a manufacturing method thereof. An insulating material including silicon-based polymer compound is coated on a substrate and a metal sheet. The substrate and the metal sheet are baked at a first temperature to semi-cure the insulating material on the substrate and the metal sheet. Afterwards, the semi-cured insulating material on the metal sheet is bonded to the semi-cured insulating material on the substrate through thermally pressing the insulating material. The pressed insulating material become cured and form an insulating layer between the substrate and the metal sheet, whereby the metal sheet is bonded to the substrate to form the printed circuit board of the invention.

The printed circuit board in accordance with an exemplary embodiment of the invention includes a first substrate, a first insulating layer and a first metal sheet. The first substrate has a first surface and a second surface opposite to the first surface. The first insulating layer is formed between the first surface of the first substrate and the first metal sheet, the first metal sheet is bonded to the first substrate via the first insulating layer, and the first insulating layer comprises a silicon-based high polymer compound.

The manufacturing method of a printed circuit board in accordance with an exemplary embodiment of the invention includes the following steps: providing a first substrate and a first metal sheet, wherein the first substrate has a first surface and a second surface; coating the first surface of the first substrate with a layer of insulating material; coating the first metal sheet with a layer of the insulating material; placing the first substrate coated with the insulating material and the first metal sheet coated with the insulating material in an heating device and baking the first substrate and the first metal sheet at a first temperature to remove solvent of the insulating material so that the insulating material is semi-cured; and bonding the semi-cured insulating material of the first substrate and the semi-cured insulating material of the first metal sheet through thermally pressing the semi-cured insulating material at a second temperature to cure the insulating material so as to form a first insulating layer between the first substrate and the first metal sheet and bond the first metal sheet to the first substrate through the first insulating layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Referring to FIGS. 2A, 2B, 2C and 3, an embodiment of a manufacturing method of a printed circuit board of the present invention is disclosed. In this embodiment, a printed circuit board with metal sheet on single side is formed.

Figure 1A:
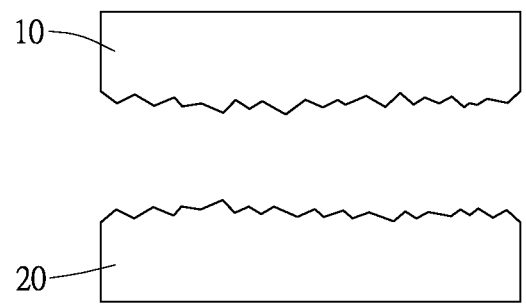
FIGS. 1A, 1B and 1C illustrate a manufacturing method of a conventional printed circuit board, wherein a cross-sectional view of the printed circuit board is illustrated.
Figure 1B:
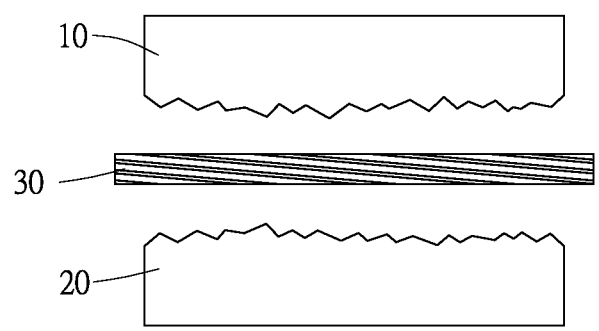
Figure 1C:
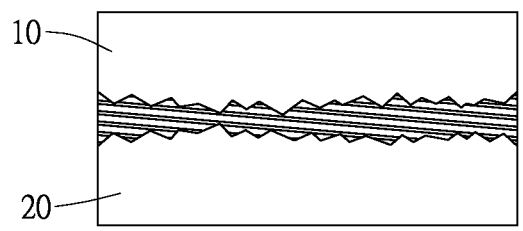
Figure 2A:
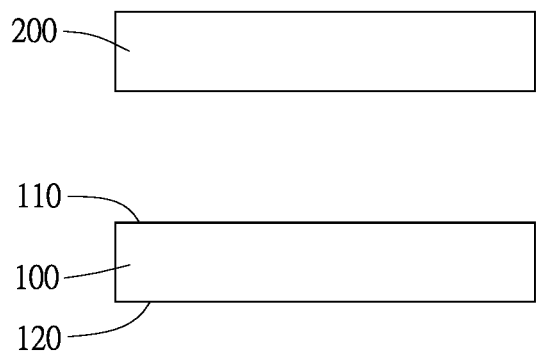
FIGS. 2A, 2B and 2C illustrate an embodiment of a manufacturing method of a printed circuit board of the present invention, wherein a cross-sectional view of the printed circuit board is illustrated.

In a step S1, as shown in FIG. 2A, a first substrate 100 and a first metal sheet 200 are provided. The first substrate 100 has a first surface 110 and a second surface 120. Afterwards, the procedure enters a step S2.

Figure 2B:
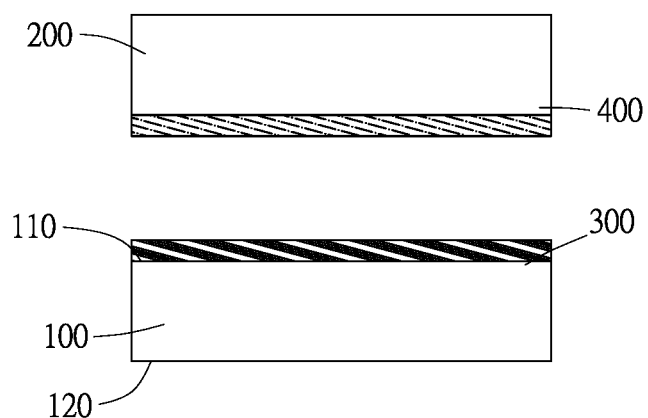

In the step S2, as shown in FIG. 2B, the first surface 110 of the first substrate 100 is coated with a layer of insulating material 300. Afterwards, the procedure enters a step S3.

In the step S3, as shown in FIG. 2B, the first metal sheet 200 is also coated with a layer of insulating material 400 which is the same as the insulating material 300. Afterwards, the procedure enters a step S4.

In the step S4, the first substrate 100 coated with the insulating material 300 and the first metal sheet 200 coated with the insulating material 400 are placed in a heating device and baked in the heating device at a first temperature to remove solvent of the insulating material 300 and solvent of the insulating material 400 so that the insulating material 300 and the insulating material 400 become semi-cured. Afterwards, the procedure enters a step S5.

Figure 2C:
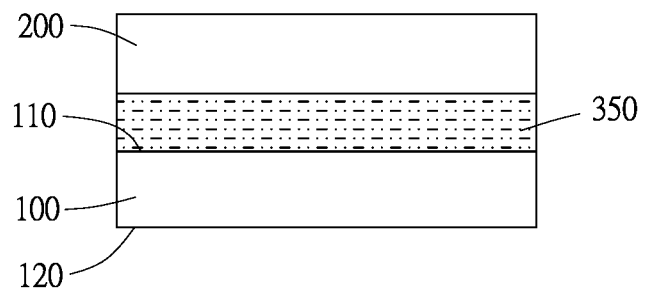
Figure 3:
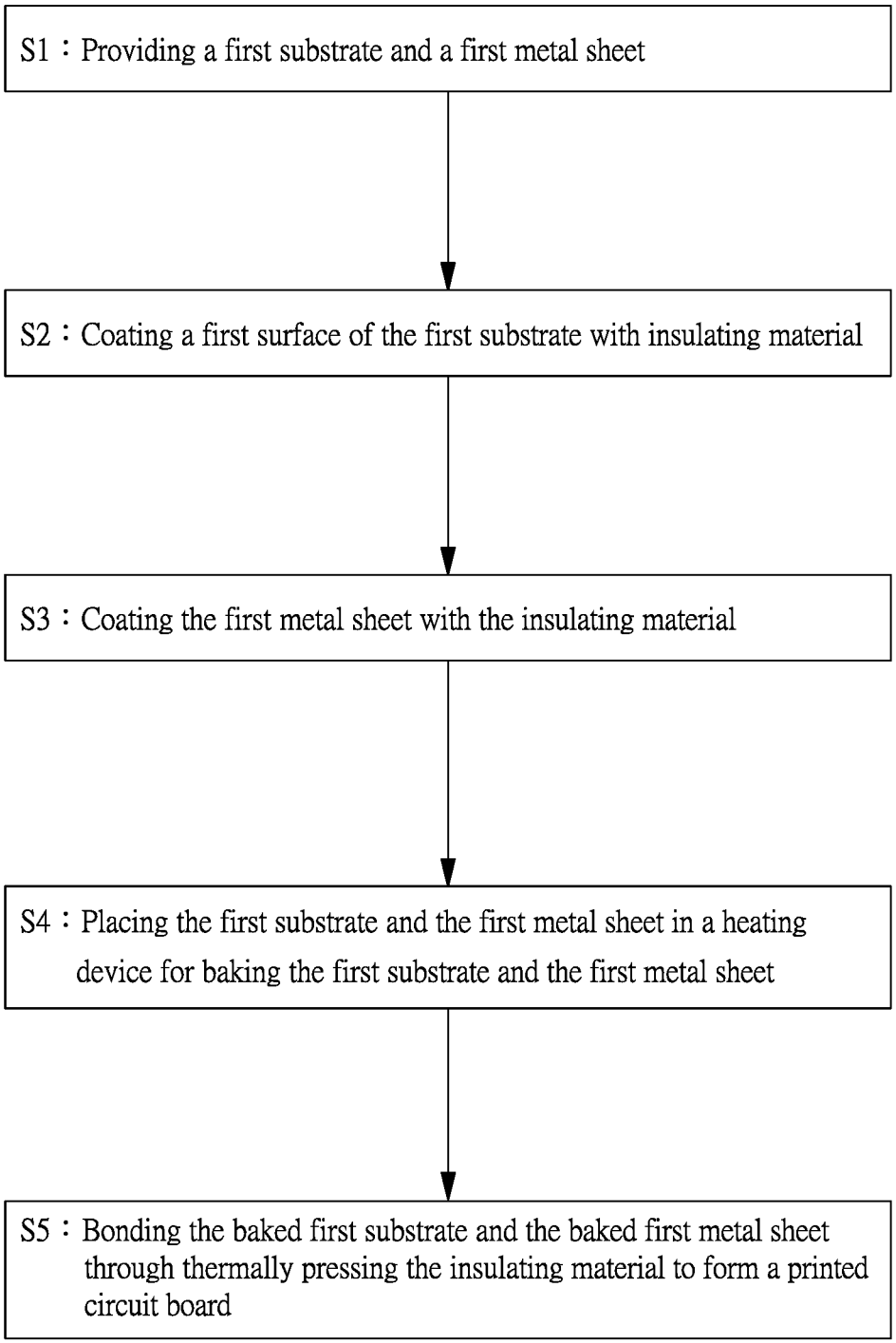
FIG. 3 is a flow chart of the embodiment of the manufacturing method of FIGS. 2A, 2B and 2C.

In the step S5, as shown in FIG. 2C, the semi-cured insulating material 400 coated on the first metal sheet 200 is bonded to the semi-cured insulating material 300 coated on the first substrate 100 through thermally pressing the semi-cured insulating material 300 and the semi-cured insulating material 400 at a second temperature. The semi-cured insulating material 300 and the semi-cured insulating material 400 are thus cured to form a first insulating layer 350 between the first substrate 100 and the first metal sheet 200, and the first metal sheet 200 is bonded to the substrate 100 through the first insulating layer 350.

In this embodiment, the first temperature is less than 150° C., and the second temperature is less than 200° C. The procedure is accomplished within 2 hours.

The insulating material 300 and the insulating material 400 include silicon-based polymer compound. The silicon-based polymer compound includes silicone resin. The silicon-based polymer compound is solved in a solvent so that the solution of the silicon-based polymer compound is easily coated on the first substrate 100 and the first metal sheet 200. The solvent is exemplarily toluene in this embodiment, but it is not limited thereto. The silicon-based polymer compound includes silicone resin such as methyl silicone resin, phenyl silicone resin, methyl phenyl silicone resin or combination of them. However, the invention is not limited hereto. Catalyst can be added into the insulating material 300 and the insulating material 400 to increase chemical reaction of the silicon-based polymer compound. In this embodiment, the insulating material 300 and the insulating material 400 further include a reinforcement material to which the silicon-based polymer is attached. In this embodiment, the reinforcement material is glass fiber woven.

The printed circuit board of the present invention manufactured by the described manufacturing method includes the first substrate 100, the first insulating layer 350 and the first metal sheet 200 to form a sandwich structure. The first insulating layer 350 has a thickness less than 80 micro-meter and a dielectric strength greater than 1 KV pro 10 micro-meter.

In this embodiment, the first metal sheet 200 is a copper sheet, and the first substrate 100 is an aluminum plate, a copper plate, a ceramic plate, an aluminum nitride plate or a composite metal plate. The bonding strength of the first metal sheet 200 to different first substrates 100 is listed as follows.

TABLE 1

| Material Product | Bonding Strength kg/cm² |
|---|---|
| commercial aluminum substrate | 3.14 |
| aluminum substrate | 6.32 |
| copper substrate | 7.82 |
| ceramic substrate | 6.54 |
| aluminum nitride substrate | 6.58 |
| composite metal substrate | 6.86 |

Table 1 shows that the printed circuit board manufactured by the manufacturing method of the present invention has a bonding strength twice as the bonding strength of the commercial aluminum substrate.

The heat conduction rate of the bonding structure which the first metal sheet 200 is bonded to different first substrates 100 is listed as follows.

TABLE 2

| Material | Heat Conduction Rate (W/mK) | |
|---|---|---|
| Printed circuit board | single side | double sides |
| commercial aluminum substrate | 2.0 | — |
| aluminum substrate | 101.61 | 72.58 |
| copper substrate | 133.71 | 95.51 |
| ceramic substrate | 12.63 | 9.02 |
| aluminum nitride substrate | 89.47 | 63.91 |
| composite metal substrate | 120.33 | 85.71 |

As shown in table 2, the printed circuit board manufactured by the manufacturing method of the present invention has a heat conduction rate several times as the heat conduction rate of the commercial aluminum substrate. This facilitates the heat conduction (heat dissipation) of electronic elements mounted on the printed circuit board.

Referring to FIGS. 4A, 4B, 4C, 4D, 4E and 5, another embodiment of the manufacturing method of the printed circuit board of the present invention is disclosed. In this embodiment, a printed circuit board with metal sheets on double sides is formed.

Figure 4A:
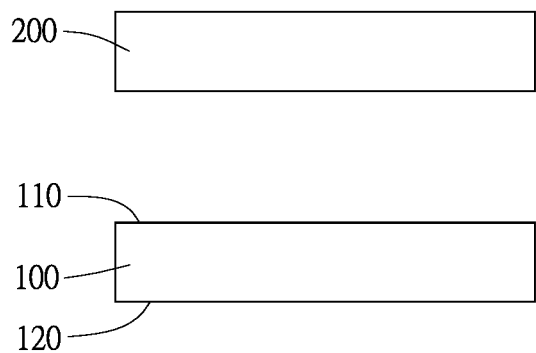
FIGS. 4A, 4B, 4C, 4D and 4E illustrate another embodiment of a manufacturing method of a printed circuit board of the present invention, wherein a cross-sectional view of the printed circuit board is illustrated.

In a step S11, as shown in FIG. 4A, a first substrate 100 and a first metal sheet 200 are provided. The first substrate 100 has a first surface 110 and a second surface 120. Afterwards, the procedure enters a step S12.

Figure 4B:
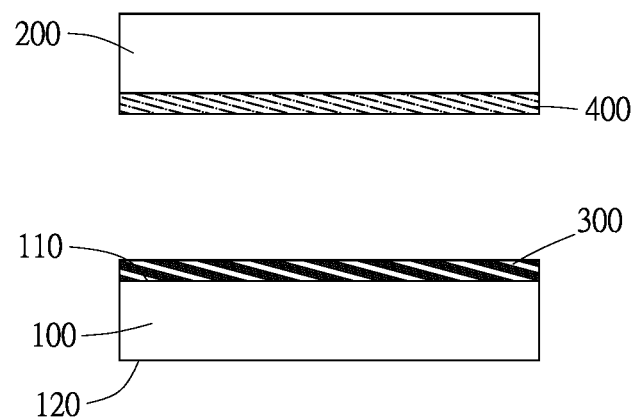

In the step S12, as shown in FIG. 4B, the first surface 110 of the first substrate 100 is coated with a layer of insulating material 300. Afterwards, the procedure enters a step S13.

In the step S13, as shown in FIG. 4B, the first metal sheet 200 is also coated with a layer of insulating material 400 which is the same as the insulating material 300. Afterwards, the procedure enters a step S14.

In the step S14, the first substrate 100 coated with the insulating material 300 and the first metal sheet 200 coated with the insulating material 400 are placed in a heating device and baked in the heating device at a first temperature to remove solvent of the insulating material 300 and solvent of the insulating material 400 so that the insulating material 300 and the insulating material 400 become semi-cured. Afterwards, the procedure enters a step S15.

Figure 4C:
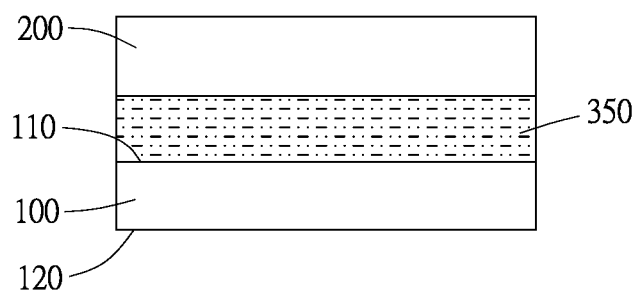

In the step S15, as shown in FIG. 4C, the semi-cured insulating material 400 coated on the first metal sheet 200 is bonded to the semi-cured insulating material 300 coated on the first substrate 100 through thermally pressing the semi-cured insulating material 300 and the semi-cured insulating material 400 at a second temperature. The semi-cured insulating material 300 and the semi-cured insulating material 400 are cured to form a first insulating layer 350, and the first metal sheet 200 is bonded to the substrate 100 through the first insulating layer 350. Afterwards, the procedure enters a step S16.

Figure 4D:
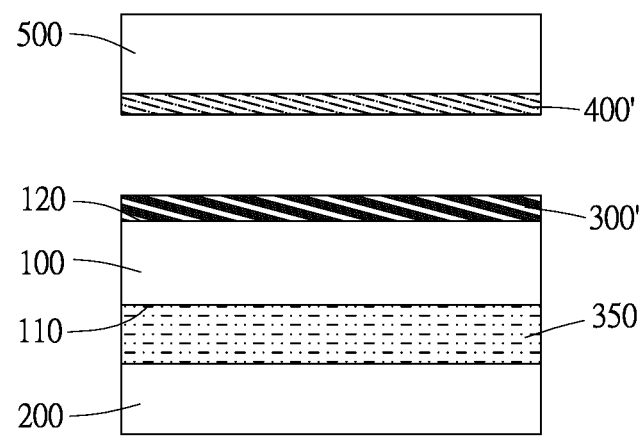
Figure 4E:
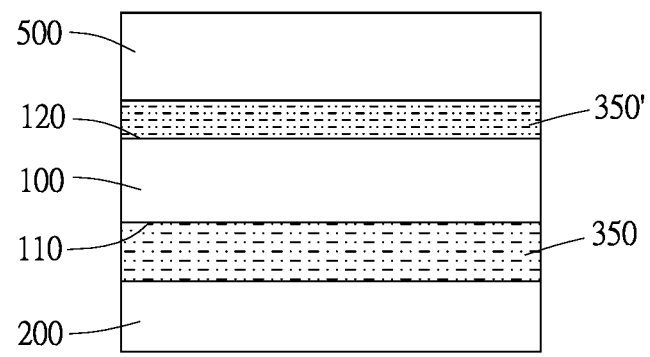
Figure 5:
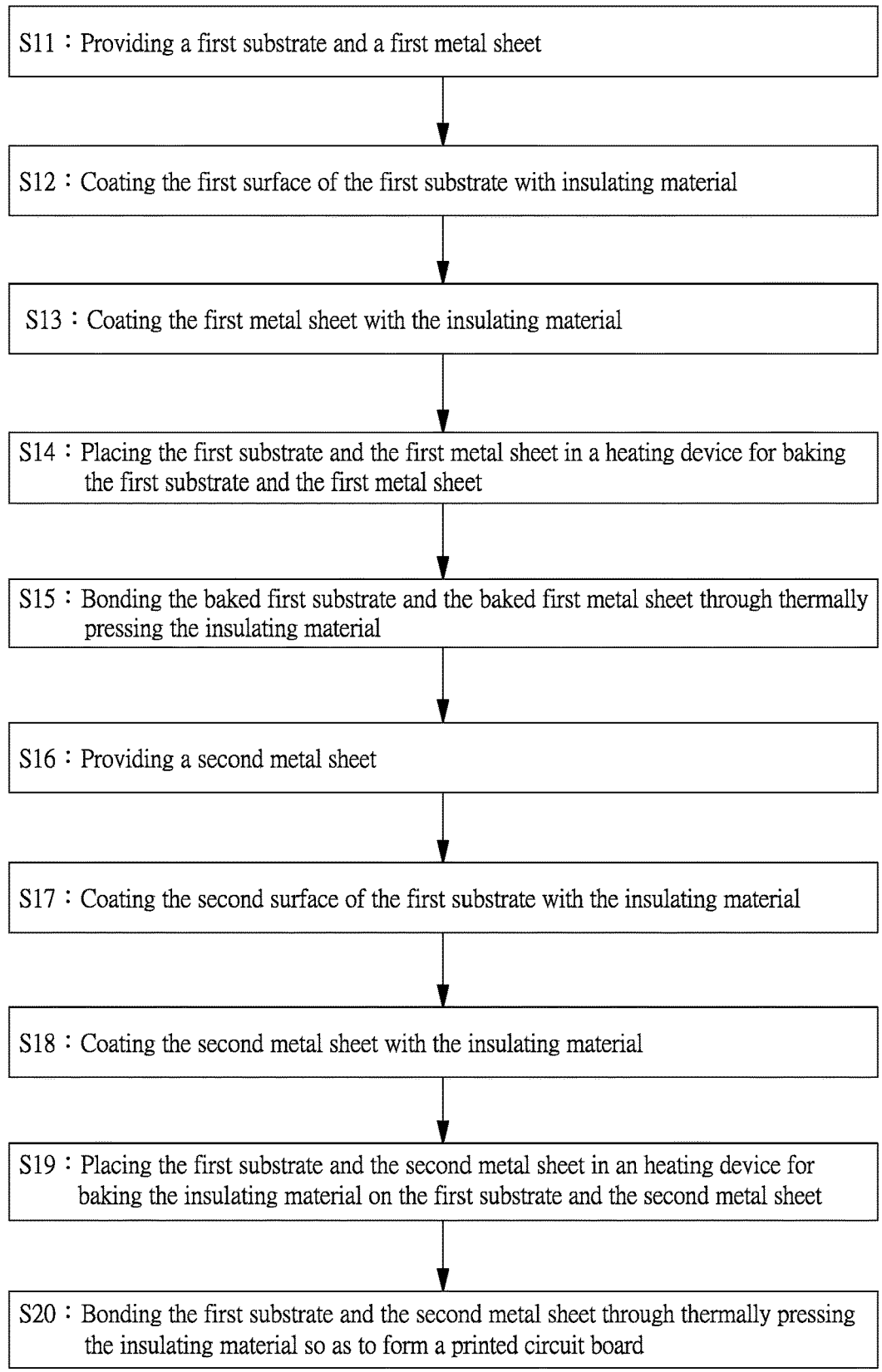
FIG. 5 is a flow chart of the embodiment of the manufacturing method of FIGS. 4A, 4B, 4C, 4D and 4E.

In the step S16, as shown in FIG. 4D, a second metal sheet 500 is provided. Afterwards, the procedure enters a step S17.

In the step S17, as shown in FIG. 4D, the second surface 120 of the first substrate 100 is coated with a layer of insulating material 300'. Afterwards, the procedure enters a step S18.

In the step S18, as shown in FIG. 4D, the second metal sheet 500 is coated with a layer of insulating material 400' which is the same as the insulating material 300'. Afterwards, the procedure enters the step S19.

In the step S19, the first substrate 100 coated with the insulating material 300' and the second metal sheet 500 coated with the insulating material 400' are placed in the heating device and baked in the heating device at the first temperature to remove solvent of the insulating material 300' and solvent of the insulating material 400' so that the insulating material 300' and the insulating material 400' become semi-cured. Afterwards, the procedure enters a step S20.

In the step S20, the semi-cured insulating material 400' coated on the second metal sheet 500 is bonded to the semi-cured insulating material 300' coated on the first substrate 100 through thermally pressing the semi-cured insulating material 300' and the semi-cured insulating material 400' at a second temperature. The semi-cured insulating material 300' and the semi-cured insulating material 400' are thus cured to form a second insulating layer 350' between the first substrate 100 and the second metal sheet 500, and the second metal sheet 500 is bonded to the substrate 100 through the second insulating layer 350'.

In this embodiment, the printed circuit board includes the first metal sheet 200, the first insulating layer 350, the first substrate 100, the second insulating layer 350' and the second metal sheet 500. The first insulating layer 350 has a thickness less than 80 micro-meter, and the second insulating layer 350' also has a thickness less than 80 micro-meter. The first insulating layer 350 has a dielectric strength greater than 1 KV pro 10 micro-meter, and the second insulating layer 350' also has a dielectric strength greater than 1 KV pro 10 micro-meter. In this embodiment, the insulating material 300' and the insulating material 400' has the same composition as the insulating material 300 and the insulating material 400. The insulating material 300' and the insulating material 400' includes silicon-based polymer compound and reinforcement material. The second metal sheet 500 is a copper sheet.

Referring to FIGS. 6A, 6B, 6C, 6D, 6E and 7, another embodiment of the manufacturing method of the printed circuit board of the present invention is disclosed. In this embodiment, a printed circuit board with bi-substrates and a metal sheet on single side is formed.

Figure 6A:
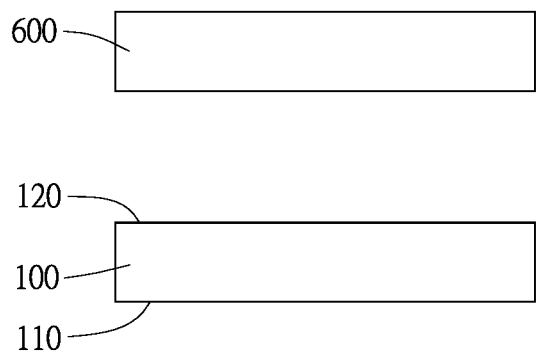
FIGS. 6A, 6B, 6C, 6D and 6E illustrate another embodiment of a manufacturing method of a printed circuit board of the present invention, wherein a cross-sectional view of the printed circuit board is illustrated.

In a step S21, as shown in FIG. 6A, a first substrate 100 and a second substrate 600 are provided. The first substrate 100 has a first surface 110 and a second surface 120. Afterwards, the procedure enters a step S22.

Figure 6B:
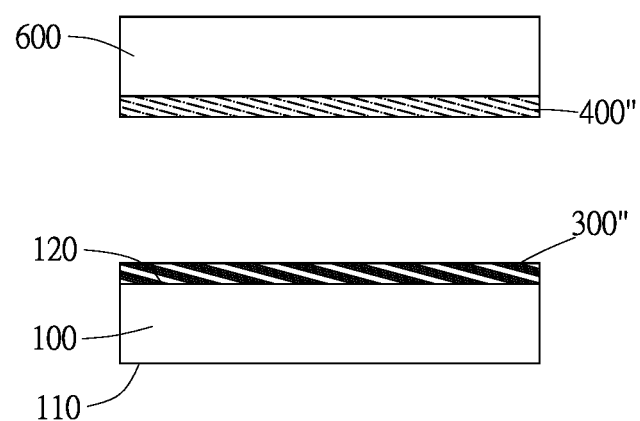

In the step S22, as shown in FIG. 6B, the second surface 120 of the first substrate 100 is coated with a layer of insulating material 300". Afterwards, the procedure enters a step S23.

In the step S23, as shown in FIG. 6B, the second substrate 600 is also coated with a layer of insulating material 400" which is the same as the insulating material 300". Afterwards, the procedure enters a step S24.

In the step S24, the first substrate 100 coated with the insulating material 300" and the second substrate 600 coated with the insulating material 400" are placed in a heating device and baked in the heating device at a first temperature to remove the solvent of the insulating material 300" and the insulating material 400" so that the insulating material 300" and the insulating material 400" become semi-cured. Afterwards, the procedure enters a step S25.

Figure 6C:
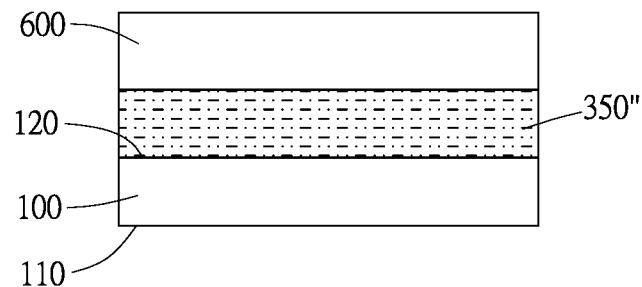

In the step S25, as shown in FIG. 6C, the semi-cured insulating material 400" coated on the second substrate 600 is bonded to the semi-cured insulating material 300" coated on the first substrate 100 through thermally pressing the semi-cured insulating material 300" and the semi-cured insulating material 400" at the second temperature. The semi-cured insulating material 300" and the semi-cured insulating material 400" are thus cured to form a third insulating layer 350" between the first substrate 100 and the second substrate 600, and the second substrate 600 is bonded to the substrate 100 through the third insulating layer 350". Afterwards, the procedure enters a step S26.

Figure 6D:
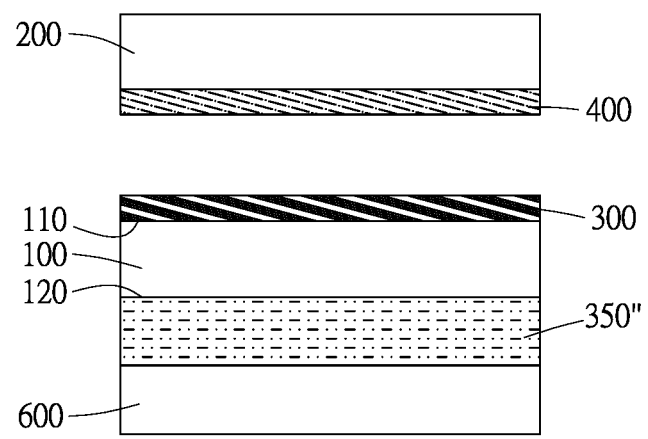

In the step S26, as shown in FIG. 6D, a first metal sheet 200 is provided. Afterwards, the procedure enters a step S27.

In the step S27, as shown in FIG. 6D, the first surface 110 of the first substrate 100 which has been bonded to the second substrate 600 is coated with a layer of insulating material 300. Afterwards, the procedure enters a step S28.

In the step S28, as shown in FIG. 6D, the first metal sheet 200 is coated with a layer of insulating material 400 which is the same as the insulating material 300. Afterwards, the procedure enters a step S29.

In the step S29, the first substrate 100 coated with the insulating material 300 and the first metal sheet 200 coated with the insulating material 400 are placed in the heating device and baked in the heating device at the first temperature to remove the solvent of the insulating material 300 and the solvent of the insulating material 400 so that the insulating material 300 and the insulating material 400 become semi-cured. Afterwards, the procedure enters a step S30.

Figure 6E:
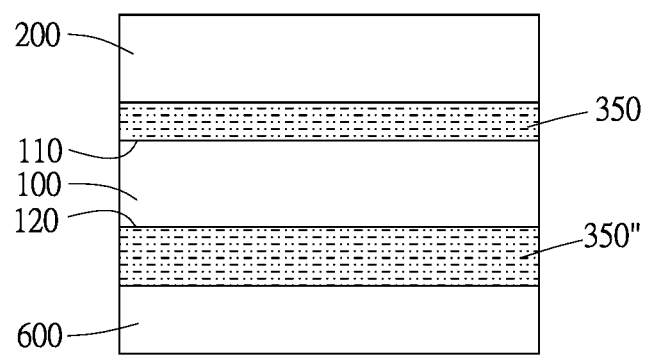
Figure 7:
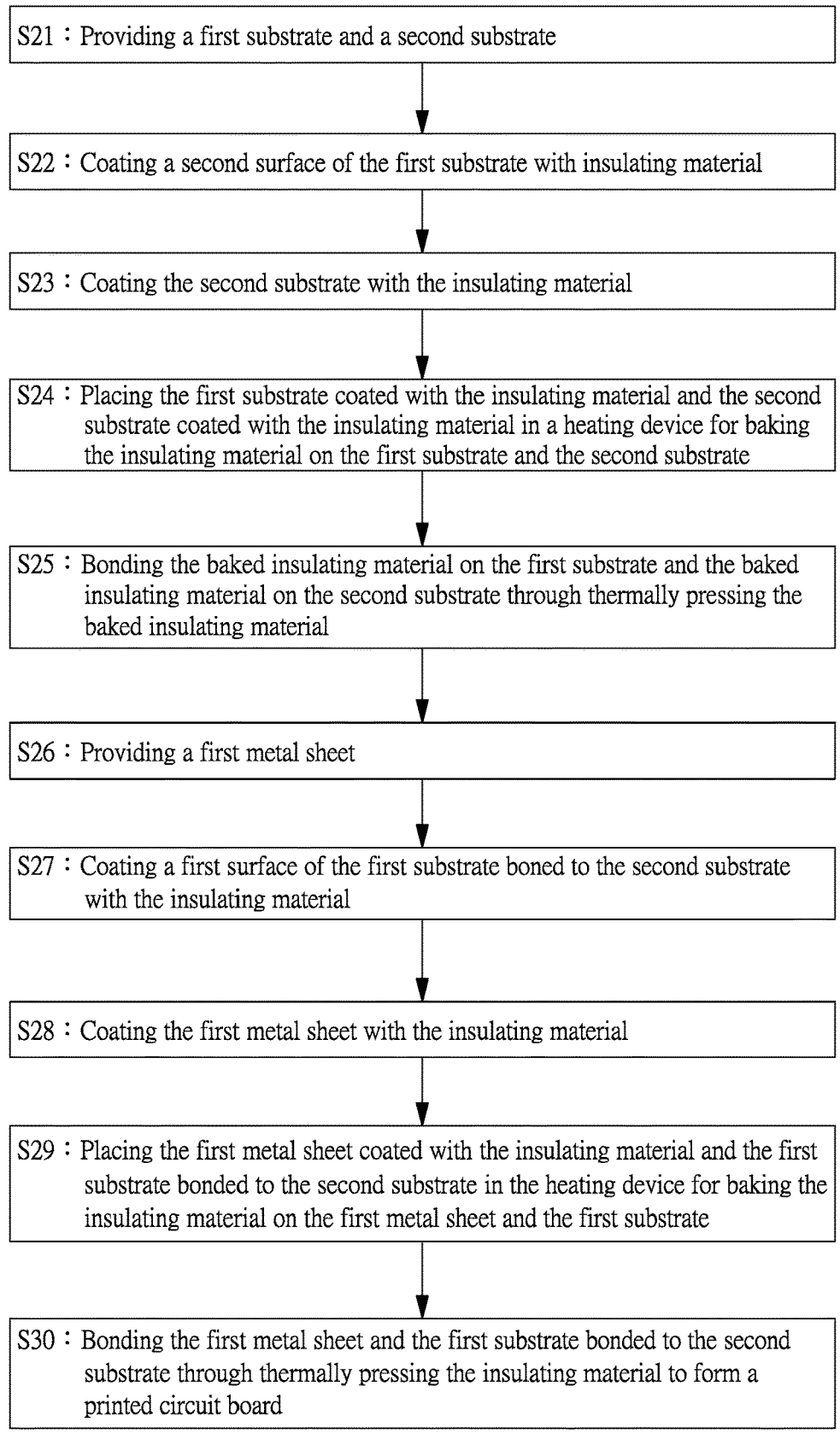
FIG. 7 is a flow chart of the embodiment of the manufacturing method of FIGS. 6A, 6C, 6D and 6E.

In the step S30, as shown in FIG. 6E, the semi-cured insulating material 400 on the first metal sheet 200 is bonded to the semi-cured insulating material 300 on the first substrate 100 through thermally pressing the semi-cured insulating material 300 and the semi-cured insulating material 400 at the second temperature. The semi-cured insulating material 300 and the semi-cured insulating material 400 are thus cured to form a first insulating layer 350 between the first substrate 100 and the first metal sheet 200, and the first metal sheet 200 is bonded to the first substrate 100 through the first insulating layer 350.

In this embodiment, the first insulating layer 350 has a thickness less than 80 micro-meter, and the third insulating layer 350" also has a thickness less than 80 micro-meter. The first insulating layer 350 has a dielectric strength greater than 1 KV pro 10 micro-meter, and the third insulating layer 350" also has a dielectric strength greater than 1 KV pro 10 micro-meter. In this embodiment, the insulating material 300" and the insulating material 400" has the same composition as the insulating material 300 and the insulating material 400. The insulating material 300" and the insulating material 400" also includes silicon-based polymer compound and reinforcement material. The first metal sheet 200 is a copper sheet.

Referring to FIGS. 8A, 8B, 8C, 8D, 8E and 9, another embodiment of the manufacturing method of the printed circuit board of the present invention is disclosed. In this embodiment, a printed circuit board with bi-substrates and metal sheets on double sides is formed.

Figure 8A:
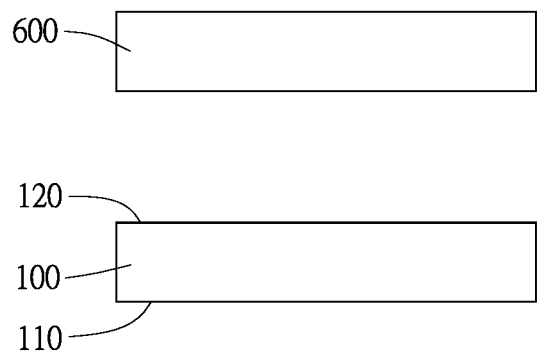
FIGS. 8A, 8B, 8C, 8D and 8E illustrate another embodiment of a manufacturing method of a printed circuit board of the present invention, wherein a cross-sectional view of the printed circuit board is illustrated.

In a step S31, as shown in FIG. 8A, a first substrate 100 and a second substrate 600 are provided. The first substrate 100 has a first surface 110 and a second surface 120, and the second substrate 600 has a third surface 610 and a fourth surface 620. Afterwards, the procedure enters a step S32.

Figure 8B:
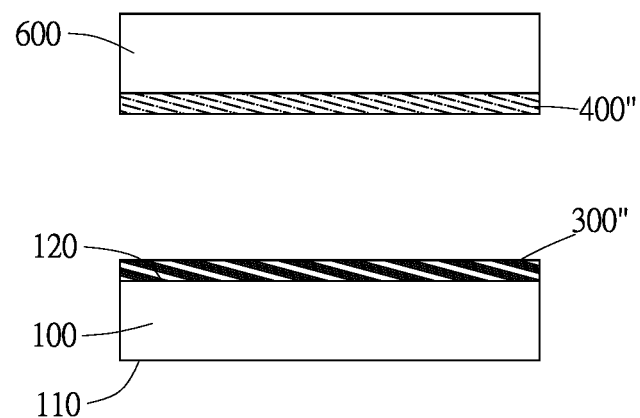

In the step S32, as shown in FIG. 8B, the second surface 120 of the first substrate 100 is coated with a layer of insulating material 300". Afterwards, the procedure enters a step S33.

In the step S33, as shown in FIG. 8B, the fourth surface 620 of the second substrate 600 is also coated with a layer of insulating material 400" which is the same as the insulating material 300". Afterwards, the procedure enters a step S34.

In the step S34, the first substrate 100 coated with the insulating material 300" and the second substrate 600 coated with the insulating material 400" are placed in a heating device and baked in the heating device at a first temperature to remove solvent of the insulating material 300" and solvent of the insulating material 400" so that the insulating material 300" and the insulating material 400" become semi-cured. Afterwards, the procedure enters a step S35.

Figure 8C:
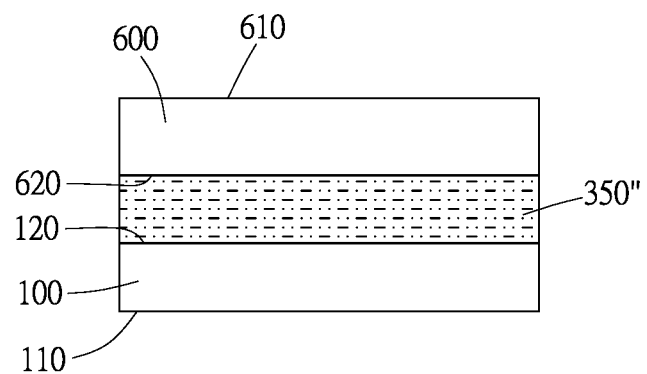

In the step S35, as shown in FIG. 8C, the semi-cured insulating material 400" on the second substrate 600 is bonded to the semi-cured insulating material 300" on the first substrate 100 through thermally pressing the semi-cured insulating material 300" and the semi-cured insulating material 400" at a second temperature. The semi-cured insulating material 300" and the semi-cured insulating material 400" are thus cured to form a third insulating layer 350" between the first substrate 100 and the second substrate 600, and the second substrate 600 is bonded to the first substrate 100 through the third insulating layer 350". Afterwards, the procedure enters a step S36.

Figure 8D:
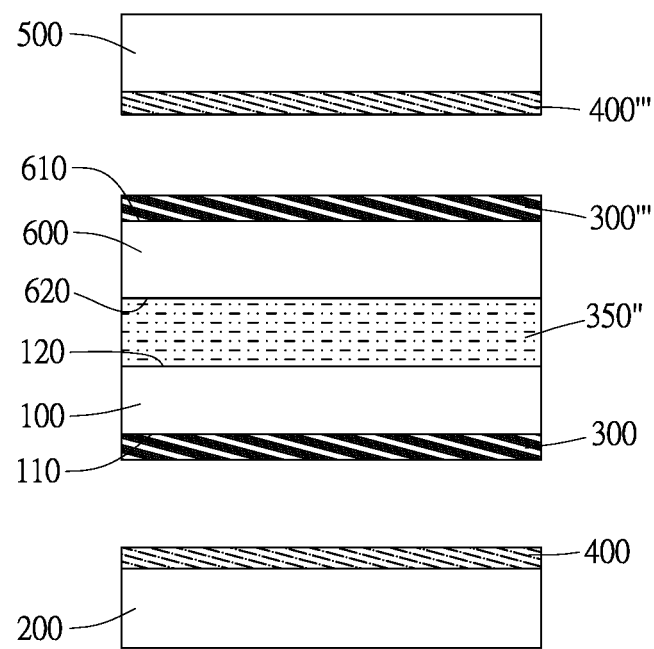

In the step S36, as shown in FIG. 8D, a first metal sheet 200 and a second metal sheet 500 are provided. Afterwards, the procedure enters a step S37.

In the step S37, as shown in FIG. 8D, the first surface 110 of the first substrate 100 which has been bonded to the second substrate 600 is coated with a layer of the insulating material 300. Afterwards, the procedure enters a step S38.

In the step S38, as shown in FIG. 8D, the first metal sheet 200 is coated with a layer of insulating material 400. Afterwards, the procedure enters a step S39.

In the step S39, the second metal sheet 500 is coated with a layer of insulating material 400'''. Afterwards, the procedure enters a step S40.

In the step S40, the third surface 610 of the second substrate 600 is coated with a layer of insulating material 300'''. Afterwards, the procedure enters a step S41.

In the step S41, the first substrate 100 coated with insulating material 300, the first metal sheet 200 coated with the insulating material 400, the second substrate 600 coated with the insulating material 300''' and the second metal sheet 500 coated with the insulating material 400''' are placed in the heating device and baked in the heating device at the first temperature to remove solvent of the insulating material 300, 400, 300''' and 400''' so that the insulating material 300, 400, 300''' and 400''' become semi-cured. Afterwards, the procedure enters a step S42.

Figure 8E:
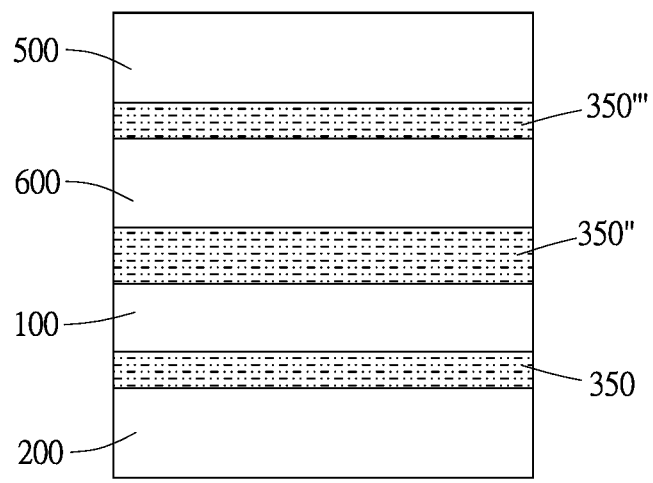
Figure 9:
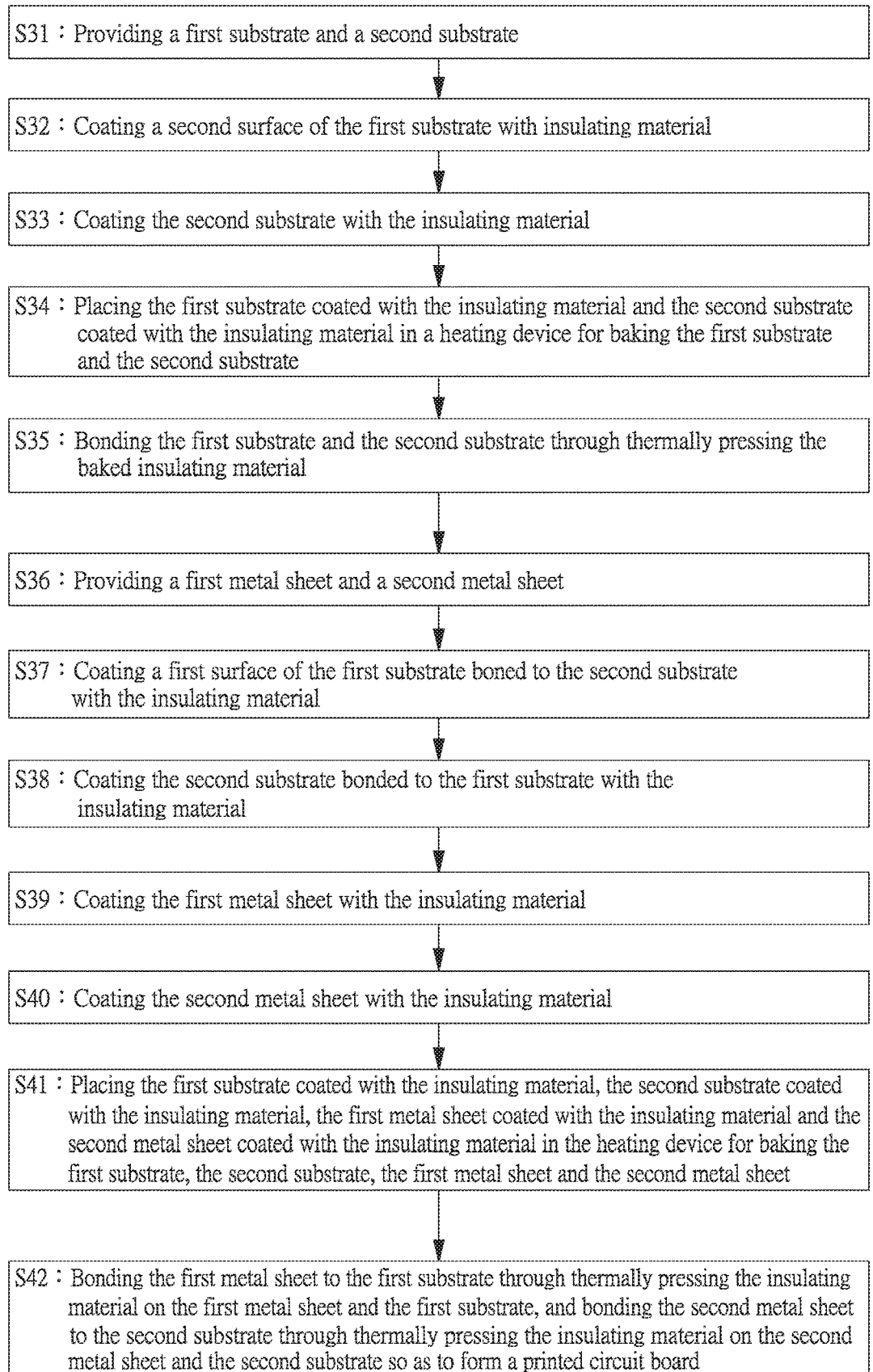
FIG. 9 is a flow chart of the embodiment of the manufacturing method of FIGS. 8A, 8C, 8D and 8E.

In the step S42, as shown in FIG. 8E, the semi-cured insulating material 400''' on the second metal sheet 500 is bonded to the semi-cured insulating material 300''' on the second substrate 600 through thermally pressing the semi-cured insulating material 300''' and the semi-cured insulating material 400''' at the second temperature. The semi-cured insulating material 400 on the second metal sheet 500 is bonded to the semi-cured insulating material 300 on the second substrate 600 through thermally pressing the semi-cured insulating material 300 and the semi-cured insulating material 400 at the second temperature. The semi-cured insulating material 300 and the semi-cured insulating material 400 are thus cured to form a first insulating layer 350, and the first metal sheet 200 is bonded to the first substrate 100 through the first insulating layer 350. The semi-cured insulating material 300''' and the semi-cured insulating material 400''' are thus cured to form a fourth insulating layer 350''', and the second metal sheet 500 is bonded to the second substrate 600 through the fourth insulating layer 350'''.

In this embodiment, the first insulating layer 350 has a thickness less than 80 micro-meter, the third insulating layer 350" also has a thickness less than 80 micro-meter, and the fourth insulating layer 350''' also has a thickness less than 80 micro-meter. The first insulating layer 350 has a dielectric strength greater than 1 KV pro 10 micro-meter, the third insulating layer 350" also has a dielectric strength greater than 1 KV pro 10 micro-meter, and the fourth insulating layer 350''' also has a dielectric strength greater than 1 KV pro 10 micro-meter. In this embodiment, the insulating material 300''' and the insulating material 400''' has the same composition as the insulating material 300 and the insulating material 400. The insulating material 300 and the insulating material 400 include silicon-based polymer compound and reinforcement material. The second metal sheet 500 is a copper sheet.

The printed circuit board of the present invention utilizes the silicon-based polymer compound replacing the conventional insulating plastic film, and the copper sheet is bonded to the substrate through a chemical method which provides a stronger bonding strength than the conventional physical method and maintains the same dielectric strength as the conventional physical method. However, the thickness of the insulating layer formed by the manufacturing method of the present invention is smaller than the conventional method, and this reduces thermal resistance of the insulating layer and thus improve the heat conduction rate. In addition, the manufacturing method of the present invention save more labor time than the conventional method.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A printed circuit board, comprising:
  a first substrate having a first surface and a second surface opposite to the first surface;
  a first insulating layer and a second insulating layer; and
  a first metal sheet having a first surface and a second surface opposite to the first surface, and the first surface of the first metal sheet facing to the first surface of the first substrate,
  wherein
  the first insulating layer is formed on the first surface of the first substrate and the second insulating layer is formed on the first surface of the first metal sheet, the first insulating layer is bonded to the second insulating layer to form a third insulating layer to make the first metal sheet bonded to the first substrate via the third insulating layer, each of the first insulating layer and the second insulating layer comprises a silicon-based polymer compound, the third insulating layer has a thickness less than 80 micro-meter and has a dielectric strength greater than 1 KV per 10 micro-meter, and the first substrate is an aluminum plate, a copper plate, an aluminum nitride plate or a composite metal plate.

2. The printed circuit board as claimed in claim 1, wherein the silicon-based polymer compound comprises silicone resin material.

3. The printed circuit board as claimed in claim 2, wherein each of the first insulating layer and the second insulating layer further comprises a reinforcement material to which the silicon-based polymer compound is attached.

4. The printed circuit board as claimed in claim 1, wherein the first metal sheet is a copper sheet.

5. The printed circuit board as claimed in claim 1, further comprising:

a second metal sheet and a fourth insulating layer, wherein the fourth insulating layer is formed between the second surface of the first substrate and the second metal sheet, the second metal sheet is bonded to the second surface of the first substrate via the fourth insulating layer, and the fourth insulating layer comprises the silicon-based polymer compound.

6. The printed circuit board as claimed in claim 1, further comprising:

a second substrate and a fourth insulating layer, wherein the fourth insulating layer is formed between the second surface of the first substrate and the second substrate, the second substrate is bonded to the second surface of the first substrate via the fourth insulating layer, and the fourth insulating layer comprises a silicon-based polymer compound.

7. The printed circuit board as claimed in claim 6, further comprising:

a second metal sheet and a fifth insulating layer, wherein the fifth insulating layer is formed between the second metal sheet and the second substrate, the second metal sheet is bonded to the second substrate via the fifth insulating layer, and the fifth insulating layer is the silicon-based polymer compound.

8. A method of manufacturing a printed circuit board, comprising:

providing a first substrate and a first metal sheet, wherein each of the first substrate and the first metal sheet has a first surface and a second surface;

coating the first surface of the first substrate with a first insulating layer;

coating the first surface of the first metal sheet with a second insulating layer;

placing the first substrate coated with the first insulating layer and the first metal sheet coated with the second insulating layer in an in a heating device and baking the first substrate and the first metal sheet at a first temperature to remove solvent of the first and second insulating layers so that the first and second insulating layers are semi-cured; and with the first surface of the first metal sheet facing to the first surface of the first substrate, bonding the semi-cured first insulating layer of the first substrate and the semi-cured second insulating layer of the first metal sheet through thermally pressing the semi-cured first and second insulating layers at a second temperature to cure the first and second insulating layers so as to form a third insulating layer between the first substrate and the first metal sheet and bond the first metal sheet to the first substrate through the third insulating layer, wherein each of the first insulating layer and the second insulating layer comprises a silicon-based polymer compound, the third insulating layer has a thickness less than 80 micro-meter and has a dielectric strength greater than 1 KV per 10 micro-meter, and the first substrate is an aluminum plate, a copper plate, an aluminum nitride plate or a composite metal plate.

9. The method as claimed in claim 8, further comprising:

providing a second metal sheet;

coating the second surface of the first substrate with a fourth insulating layer;

coating the second metal sheet with a fifth insulating layer;

placing the first substrate coated with the fourth insulating layer and the second metal sheet coated with the fifth insulating layer in the heating device and baking the first substrate and the second metal sheet at the first temperature to remove solvent of the fourth and fifth insulating layers so that the fourth and fifth insulating layers are semi-cured; and bonding the semi-cured fourth insulating layer of the first substrate and the semi-cured fifth insulating layer of the second metal sheet through thermally pressing the semi-cured fourth and fifth insulating layers at the second temperature to cure the fourth and fifth insulating layers so as to form a sixth insulating layer between the first substrate and the second metal sheet and bond the second metal sheet to the first substrate through the sixth insulating layer.

10. The method as claimed in claim 8, further comprising:

providing a second substrate;

coating the second surface of the first substrate with a fourth insulating layer;

coating the second substrate with a fifth insulating layer;

placing the first substrate coated with the fourth insulating layer and the second substrate coated with the fifth insulating layer in the heating device and baking the first substrate and the second substrate at the first temperature to remove solvent of the fourth and fifth insulating layers so that the fourth and fifth insulating layers are semi-cured; and bonding the semi-cured fifth insulating layer of the second substrate and the semi-cured fourth insulating layer of the first substrate through thermally pressing the semi-cured fourth and fifth insulating layers at the second temperature to cure the fourth and fifth insulating layers so as to form a sixth insulating layer between the first substrate and the second substrate and bond the second substrate to the first substrate through the sixth insulating layer.

11. The method as claimed in claim 10, further comprising:

providing a second metal sheet;

coating the second substrate with a seventh insulating layer;

coating the second metal sheet with an eighth insulating layer;

placing the second substrate coated with the seventh insulating layer and the second metal sheet coated with the eighth insulating layer in the heating device and baking the second substrate and the second metal sheet at the first temperature to remove solvent of the seventh and eighth insulating layers so that the seventh and eighth insulating layers are semi-cured; and bonding the semi-cured seventh insulating layer of the second substrate and the semi-cured eighth insulating layer of the second metal sheet through thermally pressing the semi-cured seventh and eighth insulating layers at the second temperature to cure the seventh and eighth insulating layers so as to form a ninth insulating layer between the second substrate and the second metal sheet and bond the second metal sheet to the second substrate through the ninth insulating layer.

12. The method as claimed in claim 8, wherein the silicon-based polymer compound comprises silicone resin.

13. The method as claimed in claim 12, wherein each of the first insulating layer and the second insulating layer further comprises a reinforcement material to which the silicon-based polymer compound is attached.

14. The method as claimed in claim 8, wherein the first temperature is less than 150° C.

15. The method as claimed in claim 8, wherein the second temperature is less than 200° C.

16. The method as claimed in claim 8, wherein the method is accomplished within 2 hours.

17. The method as claimed in claim 8, wherein the first metal sheet is a copper sheet.

18. The printed circuit board as claimed in claim 1, wherein
    the silicon-based polymer compound includes at least one of methyl silicone resin, phenyl silicone resin, or methyl phenyl silicone resin.

19. The printed circuit board as claimed in claim 1, wherein
    a bonding strength of the first metal sheet to the first substrate is from 6.32 to 7.82 kg/cm$^2$, and
    a heat conduction rate of a bonding structure, in which the first metal sheet is bonded to the first substrate, is from 89.47 to 133.71 W/mK.

20. The printed circuit board as claimed in claim 3, wherein
    the reinforcement material is glass fiber woven.

* * * * *